US012689348B2

(12) United States Patent
Fratti

(10) Patent No.: US 12,689,348 B2
(45) Date of Patent: Jul. 21, 2026

(54) VESTIGIAL LOADS FOR ACOUSTIC RESONATORS

(71) Applicant: Avago Technologies International Sales Pte. Limited, Singapore (SG)

(72) Inventor: Roger Fratti, Mohnton, PA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 121 days.

(21) Appl. No.: 18/651,157

(22) Filed: Apr. 30, 2024

(65) Prior Publication Data

US 2025/0337384 A1     Oct. 30, 2025

(51) Int. Cl.
*H03H 9/00* (2006.01)
*H10W 44/20* (2026.01)

(52) U.S. Cl.
CPC .......... *H03H 9/0004* (2013.01); *H10W 44/20* (2026.01); *H10W 44/248* (2026.01)

(58) Field of Classification Search
CPC ............. H04L 12/40169; H04L 12/417; H04L 12/6418; H04L 2007/047; H04L 2012/40215; H04L 2012/5638; H04L 2012/6427; H04L 25/0298; H04L 7/0008; H04L 43/50; H04L 5/20; H04B 3/46; H04B 2203/5425; H04B 2203/5483; H04B 2203/5491; H04B 2203/5495; H04B 3/493; H04B 3/56; H04B 1/406; H04B 15/04; H04B 1/40; H04B 17/103; H04B 17/14; H04B 3/02; H04B 3/145; H04B 3/54; H03H 9/0004; H01L 23/66; H01L 2223/6677; G11C 29/021; G11C 29/4401; G11C 7/1057; G11C 7/1084; G11C 7/14; G11C 11/4076; G11C 11/4093; G11C 7/02; G11C 7/222; G11C 5/147; G11C 7/1006; G11C 7/1078; G01R 31/312; G01R 31/11; G01R 27/04; G01R 35/005; G01R 27/32;
(Continued)

(56) References Cited

U.S. PATENT DOCUMENTS

| 6,414,565 B1 * | 7/2002 | Tanaka .................... H01P 1/227 |
| | | 333/81 R |
| 7,003,275 B1 * | 2/2006 | Petrovic ................... H04L 5/06 |
| | | 455/114.3 |

(Continued)

OTHER PUBLICATIONS

Extended European Search Report for Application No. 25173085.9 dated Sep. 22, 2025, 15 pages.
(Continued)

*Primary Examiner* — John W Poos
(74) *Attorney, Agent, or Firm* — Quarles & Brady LLP

(57) ABSTRACT

Novel tools and techniques are provided for implementing a filter circuit array, and more particularly methods, systems, and apparatuses are provided for implementing a filter circuit array in a semiconductor package or a chip package. In an embodiment, a filter array can include a first filter circuit and a first resistive circuit connected to the first filter circuit. In various cases, when the first filter circuit is operational, the first filter circuit is configured to transmit or receive one or more first signals and the first resistive circuit is unterminated. In other cases, when the first filter circuit is not operational, the first filter circuit is configured to terminate via the first resistive circuit.

20 Claims, 12 Drawing Sheets

(58) Field of Classification Search

CPC .......... G01R 31/31717; G01R 31/3025; G01R 31/318513; G01R 31/59; G01R 13/26; G01R 19/175

See application file for complete search history.

(56) References Cited

U.S. PATENT DOCUMENTS

| | | | |
|---|---|---|---|
| 2002/0196085 A1* | 12/2002 | Nakamata | H01L 23/552 |
| | | | 257/E23.114 |
| 2009/0160479 A1* | 6/2009 | Lange | H04L 25/0298 |
| | | | 326/30 |
| 2010/0244980 A1* | 9/2010 | Olson | H04N 7/104 |
| | | | 333/101 |
| 2011/0169589 A1 | 7/2011 | Franzon et al. | |

OTHER PUBLICATIONS

Bin Liu, et al.; "An Analysis and Design Method for Wide Range Reconfigurable Filter Bank Using Parallel Inductive Switch Network", IEEE Transactions on Circuits and Systems-II: Express Briefs, vol. 69, No. 8, Aug. 2022, pp. 3381-3385.

* cited by examiner

400

700

800

900

VESTIGIAL LOADS FOR ACOUSTIC RESONATORS

COPYRIGHT STATEMENT

FIELD

The present disclosure relates, in general, to methods, systems, and apparatuses for implementing a filter circuit array in a semiconductor device or wireless communication device.

BACKGROUND

Devices operating in mobile communication systems, such as cellular telephones and other wireless devices, are configured to communicate over wireless networks. In order to communicate over the wireless networks, it is often necessary to connect different signal paths of the wireless device to a common port, such as a common antenna port. For example, a wireless device can include a receiver, a transmitter, or a transceiver that are typically connected to a common antenna via the antenna port. The receiver, transmitter, or transceiver can be configured to send and receive data and control signals over the wireless network. The signal paths sending the data and control signals must be isolated from one another. Therefore, the signal paths often include one or more filter circuits in a filter circuit array formed by one or multiple band pass filter circuits that have passbands corresponding to the signal frequency bands of the respective signal paths.

However, customers, users, manufacturers or the like of the wireless devices often do not need all the filter circuits in the filter circuit array and filter circuit array designers often need to customize their design based on the filter circuits that the customers, users, manufacturers or the like need or use. This design process can be time consuming and each time the user, customer, manufacturer, or the like wants to remove a filter circuit from the filter circuit array, the filter circuit array needs to be redesigned to ensure that the filter circuits are not perturbed by the removal of the undesired filter circuit.

Hence, there is a need for more robust and scalable solutions for implementing semiconductor packages and chip packages that are customizable based on the needs of customers, users, manufacturers or the like. Thus, methods, systems, and apparatuses are provided for implementing semiconductor packages or chip packages with customizable filter circuits or filter circuit arrays.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF EMBODIMENTS

Figures 1A, 1B:
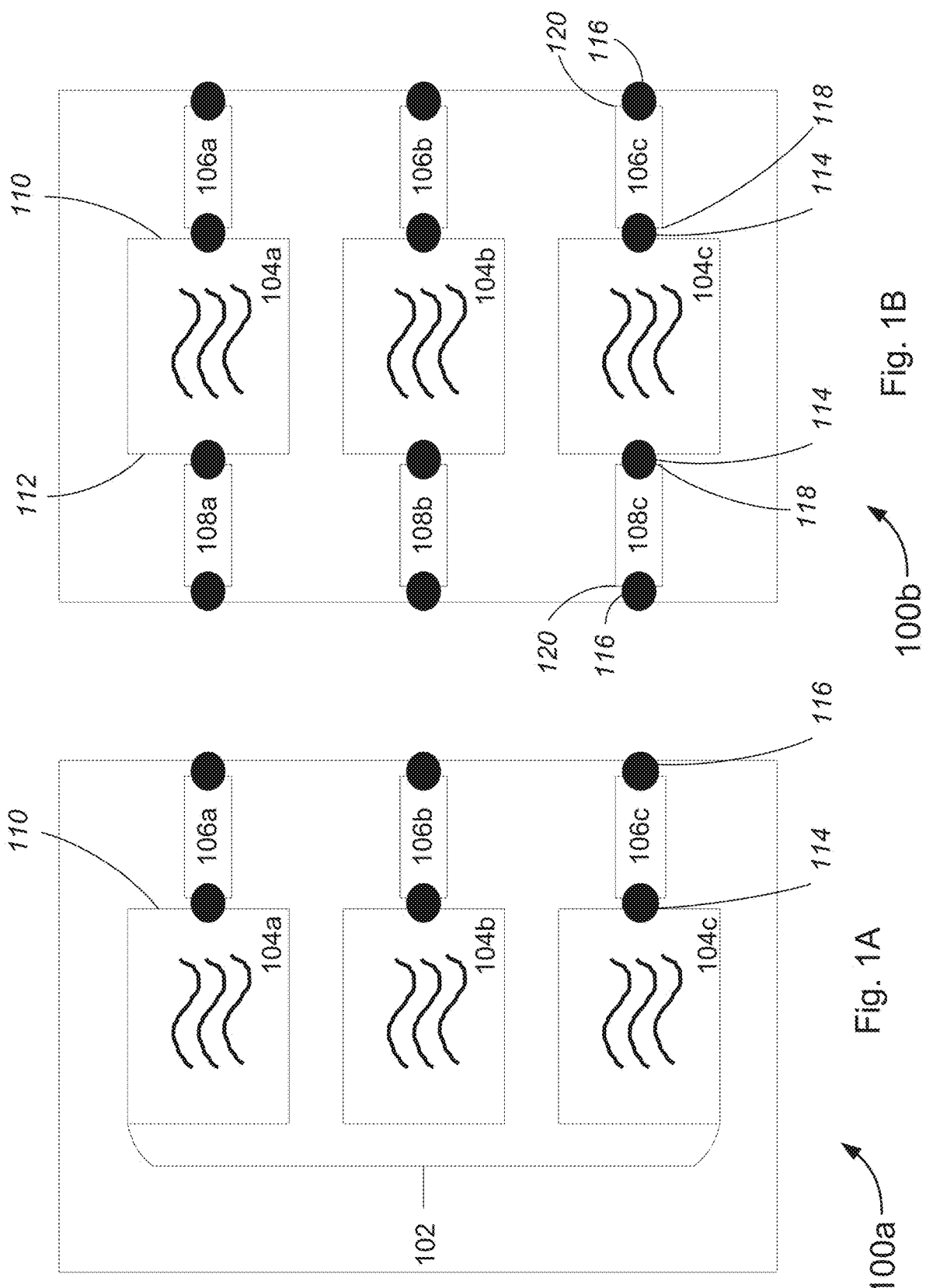
FIG. 1A is a top view of a substrate comprising one or more filter circuits and one or more first resistive circuits, in accordance with various embodiments.
FIG. 1B is a top view of another substrate comprising one or more filter circuits, one or more first resistive circuits, and one or more second resistive circuits, in accordance with various embodiments.

Various embodiments provide tools and techniques for implementing semiconductor packages or chip packages including one or more customizable filter circuit arrays are described herein.

In a first aspect, a filter circuit array can include a first filter circuit formed on a substrate and a first resistive circuit formed on the substrate and connected to the first filter circuit. In some cases, when the resistive circuit is formed on the substrate, the first resistive circuit is unterminated.

In various cases, the first resistive circuit can be connected to a first side of the first filter circuit configured to be coupled to an antenna. In some instances, a second resistive circuit can be formed on the substrate and the second resistive circuit can be connected to a second side of the first filter circuit configured to be coupled to a transceiver circuit. In other cases, a second resistive circuit formed on the substrate and the second resistive circuit can be connected to a same side of the first filter circuit as the first resistive circuit. In this scenario, the first resistive circuit and the second resistive circuit can have different impedances.

In some embodiments, a first impedance of the first resistive circuit is about 50 ohms. In other cases, a first impedance of the first resistive circuit is about a complex conjugate of a second impedance of the first filter circuit.

In various instances, the first resistive circuit comprises a first connector formed on the substrate and connected to the filter circuit and a first end of the first resistive circuit and a second connector formed on the substrate and located on a second end opposite the first end of the first resistive circuit. In some cases, when the first filter circuit is operational, a line is connected to the first connector and configured to transmit or receive a signal, and, when the first filter circuit is not operational, the second connector of the first resistive circuit is terminated.

In some cases, the first filter circuit is configured to transmit or receive one or more first signals comprising at least one of one or more first universal mobile telecommunications system (UMTS) signals, one or more first global system for mobile communication (GSM) signals, one or more first wideband code division multiple access (WCDMA) signals, or one or more first Long-Term Evolution (LTE) signals.

In another aspect, a semiconductor device can include a first filter circuit and a first resistive circuit connected to the first filter circuit. When the first filter circuit is in use, the first filter circuit can be configured to transmit or receive one or more first signals between an antenna and a transceiver and the first resistive circuit is unterminated. When the first filter circuit is not in use, the first filter circuit can be connected to a first ground via the first resistive circuit.

In some embodiments, a first impedance of the first resistive circuit is about a complex conjugate of a second impedance of the first filter circuit.

In various cases, the semiconductor device can further include a second substrate coupled to the first substrate, the second substrate comprising a matching circuit connected to the first filter circuit when the first filter circuit is in use. In various cases, a third impedance of the matching circuit is about a complex conjugate of a second impedance of the first filter circuit.

In some instances, the first substrate further includes a second filter circuit, a second resistive circuit connected to the second filter circuit, an antenna, and a transceiver. In some cases, the first filter circuit is in use, connected to the antenna and transceiver, and the first resistive circuit is unterminated and the second filter circuit is not in use and connected to a second ground via the second resistive circuit.

In various embodiments, a first impedance of the first resistive circuit is about a complex conjugate of a second impedance of the first filter circuit, a third impedance of the second resistive circuit is about a complex conjugate of a fourth impedance of the second filter circuit, and the second impedance of the first filter circuit is different from the fourth impedance of the second filter circuit. In some cases, the semiconductor device can further include a second substrate coupled to the first substrate, the second substrate comprising a matching circuit connected to the first filter circuit.

In another aspect, a method of using a filter circuit array can include providing a first substrate comprising a first filter circuit and a first resistive circuit connected to the first filter circuit. The method further including selectively configuring the first filter circuit in either of a first configuration or a second configuration, by, for the first configuration, leaving the first resistive circuit unterminated and, for the second configuration, connecting the first filter circuit to ground via the first resistive circuit.

In some instances, the filter circuit array can further include a second filter circuit and a second resistive circuit connected to the second filter circuit. The method can further include selectively configuring the second filter circuit in either of a third configuration or a fourth configuration, by, for the third configuration, leaving the second resistive circuit unterminated, and, for the fourth configuration, connecting the second filter circuit to ground via the second resistive circuit.

In various cases, the method can further include selecting the first configuration for the first filter circuit and connecting the first filter circuit to an antenna and leaving the first resistive circuit unterminated and selecting the fourth configuration for the second filter circuit and connecting the second filter circuit to ground via the second resistive circuit.

In the following description, for the purposes of explanation, numerous details are set forth to provide a thorough understanding of the described embodiments. It will be apparent to one skilled in the art, however, that other embodiments may be practiced without some of these details. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

When an element is referred to herein as being "connected," "coupled," or "attached" to another element (such as through electrical or communicative connection or coupling or a mechanical coupling or attachment), it is to be understood that the elements can be directly connected, coupled, or attached to the other element, or have intervening elements present between the elements. In contrast, when an element is referred to as being "directly connected," "directly coupled," or "directly attached" to another element, it should be understood that no intervening elements are present in the "direct" connection, coupling, or attachment between the elements. However, the existence of a direct connection, coupling, or attachment does not exclude other connections, couplings, or attachments in which intervening elements may be present.

When an element is referred to herein as being "disposed" or "located" in some manner relative to another element (e.g., disposed on, disposed between, disposed under, disposed adjacent to, or disposed in some other relative manner), it is to be understood that the elements can be directly disposed or located relative to the other element (e.g., disposed directly on another element), or have intervening elements present between the elements. In contrast, when an element is referred to as being "disposed directly" or "located directly" relative to another element, it should be understood that no intervening elements are present in the "direct" example. However, the existence of a direct disposition does not exclude other examples in which intervening elements may be present.

Likewise, when an element is referred to herein as being a "layer," it is to be understood that the layer can be a single layer or include multiple layers. For example, a conductive layer may comprise multiple different conductive materials or multiple layers of different conductive materials, and a dielectric layer may comprise multiple dielectric materials or multiple layers of dielectric materials. When a layer is described as being coupled or connected to another layer, it is to be understood that the coupled or connected layers may include intervening elements present between the coupled or connected layers. In contrast, when a layer is referred to as being "directly" connected or coupled to another layer, it should be understood that no intervening elements are present between the layers. However, the existence of directly coupled or connected layers does not exclude other connections in which intervening elements may be present.

Additionally, when an element is referred to herein as being a "circuit" or "die", it is commonly recognized as a building block of modern electronics. Circuits or dies are composed of various electronic components such as resistors, capacitors, inductors, diodes, transistors, and integrated circuits. In some cases, integrated circuits can be formed from one or more circuits. These electronic components are carefully selected and interconnected to create a circuit that can perform a specific task or carry out a particular function. Circuits can be as simple as a basic switch that turns a light on and off, or they can be incredibly complex, such as those found in advanced computer systems, communication devices, or medical equipment. Circuits can be categorized into different types based on their purpose or function, including amplifiers, oscillators, filters, power supplies, and logic gates, among others. Additionally, circuits can include software or firmware in addition to hardware or instead of hardware to carry out a particular function.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components. Additionally, terms such as first, second, third, are merely used to distinguish elements or components from each other and are not intended to imply an order, sequence, or amount unless expressly stated otherwise.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." The term "about" used herein refers to variations from the reference value or ratio of ±20% or less (e.g., ±20%, ±10%, ±5%, etc.), inclusive of the endpoints of the range unless stated otherwise.

In this application, the use of the singular includes the plural unless specifically stated otherwise, and use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

In order to communicate over wireless networks, it is often necessary to connect different signal paths of the wireless device to a common port, such as a common antenna port. The signal paths or related signal path ports are typically isolated from one another such that the signals transmitted or received on the signal paths or related signal path ports do not interfere with each other. Therefore, the signal paths typically include two or more filter circuits in a filter circuit array that have passbands corresponding to the signal frequency bands of the respective signal paths.

The filter circuit array can include or be a thin film bulk acoustic resonator (FBAR) circuit array formed on a substrate of a semiconductor device or package comprising two or more filter circuits (e.g., FBAR circuits, or the like). In some cases, the filter circuit array could be another filter circuit array such as a spectral multiband resonator (SMR) filter array, a bulk acoustic wave (BAW) filter array, or the like. In some cases, the filter circuit array could be a multiport input or output device which can be embedded within the semiconductor device or other system.

In the filter circuit array, multiple filters can be included in the semiconductor device. Each filter circuit of the filter circuit array can be designed to have particular electrical characteristics such as the ability to transmit or receive signals at a different frequency. The design of each filter is impacted by the adjacent, co-located filters which are typically arranged in parallel. The effects of the adjacent filters plays into and complicates the design of each individual filter. If a filter is removed or is unused this impacts the desired electrical characteristics of the remaining filters. Thus, designing the filter circuit array comprising multiple filter circuits takes a lot of time and effort to ensure that each filter circuit of the filter circuit array does not perturb or interfere with an other filter circuit of the filter circuit array.

However, it is often the case that one or more users, customers, manufactures, or the like of the one or more wireless devices do not need every filter circuit of the filter circuit array. Removing or not using a filter circuit from the filter circuit array can require extensive redesign of the filter circuit array to ensure that the removal or non-use of the filter circuit does not perturb or interfere with any other filter circuit of the filter circuit array. Thus, there is a need for a filter circuit array where one or more users, customers, manufactures, or the like can easily select or customize which filter circuits to use and which filter circuits not to use.

The subject technology comprises a semiconductor device (e.g., chip, integrated circuit, circuit board, printed circuit board, substrate or other semiconductor device or module) or substrate that provides a filter circuit array comprising one or more filter circuits designed for particular electrical characteristics such as the ability to transmit or receive one or more signals at one or more frequencies. In various cases, the one or more filter circuits of the filter circuit array can be formed on a monolithic substrate of the semiconductor device and each filter circuit can be configured to have specific electrical characters such as the ability to transmit or receive a specific frequency. In various cases, one or more resistive elements or resistive circuits can be connected (e.g., electrically connected or the like) to the one or more filter circuits. The one or more resistive elements can be selectively configured based on whether a corresponding filter circuit connected to the resistive circuit is going to be used or not used. When the filter circuit is in use, the one or more resistive circuits can be connected to the one or more filter circuits as vestigial loads. In other words, the one or more resistive circuits can be unterminated, dangling, or not connected to ground. When the filter circuit is not in use, the one or more filter circuits can be terminated or connected to ground via the one or more resistive circuits.

The one or more resistive elements or resistive circuits provide several advantages to the filter circuit array. For example, when the one or more filter circuits are in use and the one or more resistive circuits are connected to the one or more filter circuits as vestigial loads, the one or more resistive circuits have little to no effect on the filter circuit array or the one or more filter circuits of the filter circuit array. However, when the one or more filter circuits are not in use and the one or more filter circuits are terminated or connected to ground via the one or more resistive circuits, the one or more filter circuits are still retained within the filter circuit, but are no longer configured to transmit or receive one or more signals. In other words, the one or more resistive circuits act as one or more termination points for the one or more unused filter circuits connected to ground via the one or more resistive circuits. Additionally, not using the one or more filter circuits from the filter circuit array by connecting the one or more resistive circuits to ground does little or does not perturb or interfere with the other filter circuits that are in use on the filter circuit array. This is due to the fact that, when a filter circuit is not in use, the one or more resistive circuits are configured to provide an appropriate impedance to the unused filter circuit in the filter circuit array which keeps the characteristics of the used filter circuits from changing.

Thus, substantial product cost savings and design time can be realized since the filter circuit array can be designed based on the needs of one or more users, customers, manufactures or the like while maintaining the one or more filter circuits within the filter circuit array. In other words, one or more users, customers, manufactures or the like can selectively determine or customize which filter circuits of the filter circuit array to use or configure without designers of the filter circuit array needing to redesign the filter circuit array each time a customer wants to remove or does not want to use a particular filter circuit.

Figure 1C:
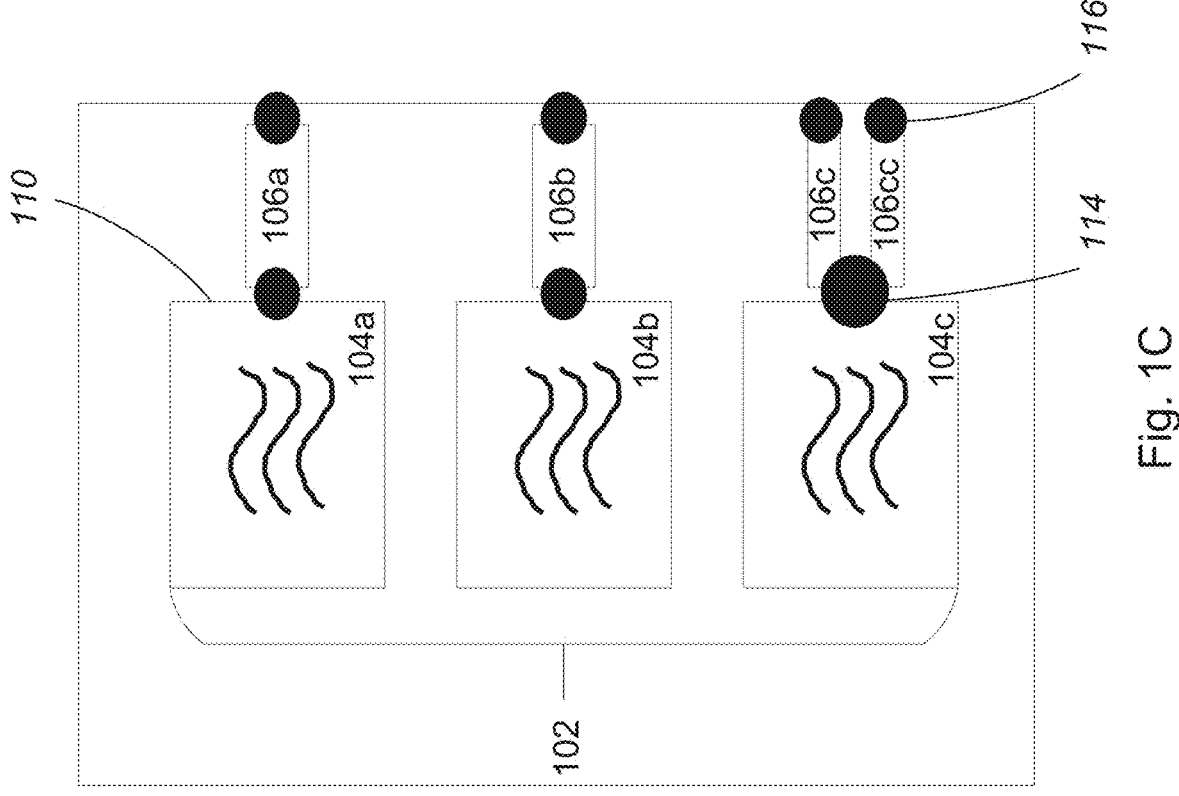
FIG. 1C is a top view of another substrate comprising one or more filter circuits and one or more first resistive circuits, in accordance with various embodiments.

FIG. 1A is a top view of a substrate 100*a* comprising one or more filter circuits 104*a*, 104*b*, and 104*c* (collectively, one or more filter circuits 104) and one or more first resistive circuits 106*a*, 106*b*, and 106*c* (collectively, one or more resistive circuits 106) coupled to a first side of the one or more filter circuits 104, in accordance with various embodiments. FIG. 1B is a top view of a substrate 100*b* comprising one or more filter circuits 104, one or more first resistive circuits 106, and one or more second resistive circuits 108*a*, 108*b*, and 108*c* (collectively, one or more second resistive circuits 108) coupled to a second side of the one or more filter circuits 104, in accordance with various embodiments. FIG. 1C is a top view of a substrate 100*c* comprising one or more filter circuits 104 and one or more first resistive circuits 106 coupled to a first side of the one or more filter circuits 104, in accordance with various embodiments.

Although substrate 100*a*-100*c* are shown as separate embodiments, a person of ordinary skill in the art would understand that different elements of each substrate could be incorporated into the other substrates and vice versa. In various cases, when substrate 100*a*-100*c* have one or more similar or same components or elements, substrate 100*a*-100*c* will be referred to as substrate 100. It should further be noted that the various components of the substrate 100 are schematically illustrated in FIGS. 1A-1C, and that modifications to the various components, component shapes, component orientation, and other arrangements of substrates 100*a*-100*c* may be possible and in accordance with the various embodiments. In addition, only some components and/or layers of the substrate 100 are shown in FIGS. 1A-1C, there could be more or less components and/or layers, in accordance with various embodiments and the substrate 100 is not intended to be limited to only the components and/or layers shown. In addition, although FIGS. 1-3, 5, and 6 are described as separate embodiments for ease of description, a person of ordinary skill would understand that various modifications to each embodiment may be applied to other embodiments.

Turning to FIGS. 1A-1C, the substrate 100 can include a supporting material (e.g., silicon, glass, ceramic, and/or any other semiconductor material or combination of materials) upon which or within which elements or components (e.g., connectors, circuits, integrated circuits, filter circuits, or the like) are fabricated or coupled. The one or more circuits, integrated circuits, filter circuits or the like can include one or more passive devices or active devices. The one or more passive devices can be one or more circuit components (e.g., conductors, resistors, capacitors, inductors, etc.) which can transmit, absorb, and/or dissipate power. The one or more active devices can be one or more circuit components (e.g., transistors, or the like) that can control the flow of power. In various cases, the substrate 100 can be formed from one or more layers. The one or more layers can include, without limitation, one or more dielectric layers, one or more device layers, one or more conducting layers, one or more insulating layers, one or more redistribution layers, and/or the like.

The substrate 100 can be included within a wireless communication device (not shown). The wireless communication device can include, but is not limited to, a mobile communication device, a phone, a tablet, a laptop, a computer, a watch, a wearable device, a gaming device, a television, or the like.

In various cases, one or more filter circuit arrays 102 (e.g., FBAR filter circuit arrays, SMR filter circuit arrays, BAW filter circuit arrays, or other multiport input or output devices, or the like) can be formed on (e.g., on or at least partially or fully within, or the like) the substrate 100. The one or more filter circuit arrays 102 can include one or more filter circuits 104 configured to transmit or receive one or more signals within the wireless communication device. In the embodiments shown in FIGS. 1A-1C, three filter circuits 104*a*-104*c* are shown, however, the filter circuit array 102 could have more or less filter circuits than those shown. Each of the filter circuits 104 of the filter circuit array 102 can be arranged in parallel. By arranging the filter circuits 104 in parallel within the filter circuit array 102, each of the filter circuits can transmit or receive one or more signals to or from a common antenna or transceiver as shown and described in FIGS. 2, 3, 5, and 6 below.

Each of the one or more filter circuits can be designed to have one or more electrical characteristics such as the ability to transmit or receive one or more frequency signals. For example, the one or more filter circuits 104 can be configured to transmit or receive at least one of one or more radio frequency (RF) signals corresponding to various predetermined wireless communication standards, such as, but not limited to, universal mobile telecommunications system (UMTS), global system for mobile communication (GSM), wideband code division multiple access (WCDMA), and Long-Term Evolution (LTE). Each of the one or more filter circuits 104 can be configured to having a passband within the frequency that the filter circuit is configured to transmit or receive.

In various cases, each of the one or more filter circuits 104 can be configured to transmit or receive a different signal frequency. In a non-limiting example, a first filter circuit 104a can be configured to transmit or receive one or more GSM signals, a second filter circuit 104b can be configured to transmit or receive one or more LTE signals, and a third filter circuit 104c can be configured to transmit or receive one or more UMTS signals.

In various cases, as discussed above, designing the filter circuit array 102 comprising the one or more filter circuits 104 can be time consuming and costly. This is due to the fact that each filter circuit of the one or more filter circuits 104 needs to be carefully arranged on or within the substrate 100 to ensure that each filter circuit does not interfere with or perturb one or more signals of another filter circuit of the one or more filter circuits 104. Thus, once designed and formed, it is not easy to remove a filter circuit that a user, customer, or manufacturer does not need. Instead, for each undesired or removed filter, the one or more designers of the filter circuit array 102 must redesign the filter circuit array 102 for the user, customer, or manufacturer.

In order to address the issues described above, the filter circuit array 102 can be customizable. In order to be customizable, the filter circuit array 102 can further include one or more first resistive circuits 106 or one or more optional second resistive circuits 108 formed on the substrate 100. Each first resistive circuit or second resistive circuit can be connected to a corresponding filter circuit on the substrate 100. The substrate 100 can be a monolithic substrate (e.g., a substrate having the filter circuit array 102 and the one or more resistive circuits 106 or 108 formed on and coupled or connected together on the single substrate). In a non-limiting example, a first first resistive circuit 106a can be connected to the first filter circuit 104a, a second first resistive circuit 106b can be connected to the second filter circuit 104b, and a third first resistive circuit 106c can be connected to the third filter circuit 104c as shown in FIG. 1A. Alternatively, a first first resistive circuit 106a and a first second resistive circuit 108a can be connected to the first filter circuit 104a, a second first resistive circuit 106b and a second second resistive circuit 106b can be connected to the second filter circuit 104b, and a third first resistive circuit 106c and a third second resistive circuit 108c can be connected to the third filter circuit 104c as shown in FIG. 1B. Alternatively, in some cases, as shown on substrate 100c of FIG. 1C, two or more first resistive circuits 106c and 106cc or two or more optional second resistive circuits (not shown) can be formed on the substrate 100 and coupled to a same side (e.g., a first side 110 or a second side 112, or the like) of a filter circuit 104c or other filter circuits of the filter circuit array 102. In various cases, the two or first resistive circuits 106c and 106cc could have different impedances or a same impedance.

The design of the one or more first resistive circuits 106 and the one or more optional second resistive circuits 108b can be included in the initial design of the filter circuit array 102 to ensure that one or more signals of each filter circuit do not interfere with or perturb one or more signals of another filter circuit of the one or more filter circuits 104. Further, the one or more first resistive circuits 106 or the one or more second resistive circuits 108 can be manufactured and included in the filter circuit array 102 and do not need to be added to the filter circuit array 102 after the filter circuit array is manufactured. In some cases, if a designer knows that a filter circuit is likely to always be used, then a corresponding resistive circuit (e.g., a first resistive circuit or a second resistive circuit) might not be included in the filter circuit array 102. However, if there is a chance that a filter circuit might not be used, then a corresponding resistive circuit (e.g., a first resistive circuit or a second resistive circuit) can then be connected to the filter circuit in the filter circuit array 102 on the substrate 100.

In various cases, the one or more first resistive circuits 106 or the one or more second resistive circuits 108 can be formed from one or more thin film processes and comprise one or more layers formed on the substrate 100. The one or more resistive circuits 106 or 108 can be formed from one or more ceramic conductors such as tantalum nitride (TaN), ruthenium oxide (RuO2), lead oxide (PbO), bismuth ruthenate (Bi2Ru2O7), nickel chromium (NiCr), or bismuth iridate (Bi2Ir2O7), or an other material capable of providing a resistive elements or the like.

In various cases, a first impedance of the one or more first resistive circuits 106 or the one or more second resistive circuits 108 can be about 50 ohms. Alternatively, in other cases, the first impedance of the one or more first resistive circuits 106 or the one or more second resistive circuits 108 can be about a complex conjugate of the real and imaginary part of a second impedance of the one or more filter circuits. By ensuring the first impedance of the one or more first resistive circuits 106 or the one or more second resistive circuits 108 can be about a complex conjugate of a second impedance of the one or more filter circuits, the reflection of the transmission of the one or more signals to the one or more first resistive circuits 106 or the one or more second resistive circuits 108 can be reduced and the power transfer can be maximized. For example, by ensuring the first impedance of the one or more first resistive circuits 106 or the one or more second resistive circuits 108 can be about a complex conjugate of a second impedance of the one or more filter circuits, the one or more first resistive circuits 106 or the one or more second resistive circuits 108 can provide a termination point having an appropriate impedance. For example, the termination point can be a ground which presents to the filter circuit the impedance that the filter circuit would have previously been subject to if the filter circuit was used.

Figure 2:
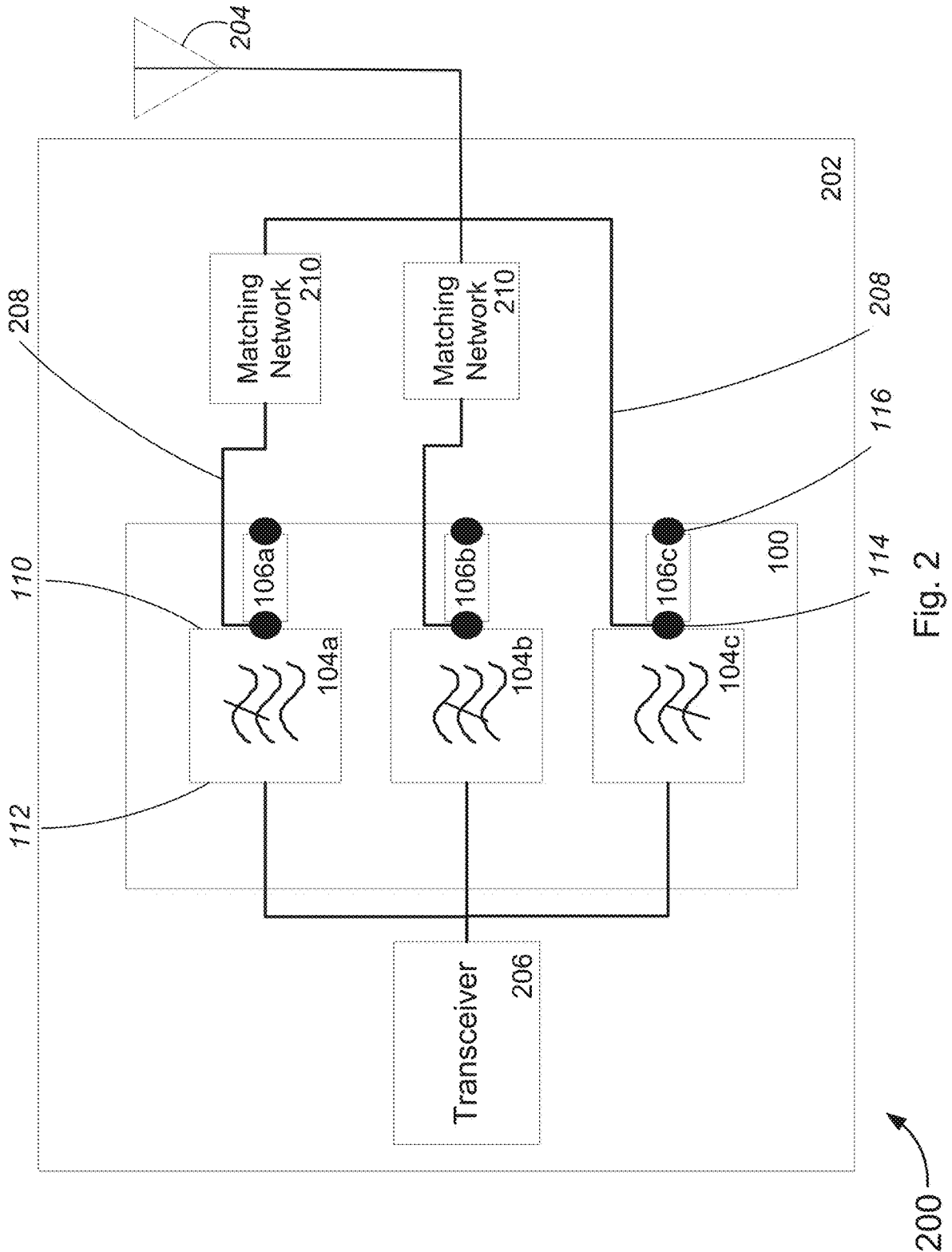
FIG. 2 is a top view of a semiconductor device comprising the substrate of FIG. 1, in accordance with various embodiments.

In some embodiments, the one or more first resistive circuits 106 can be connected to a first side 110 of the one or more filter circuits 104 as shown in FIGS. 1A, 2, and 3. In various cases, the first side 110 of the one or more filter circuits 104 can be an antenna-side of the one or more filter circuits 104. In other words, the first side 110 can be a side of the one or more filter circuits 104 that comprises a signal path that is configured to connect an antenna. Alternatively, in other cases, the one or more first resistive circuits 106 can be connected to a second side 112 opposite the first side 110 of the one or more filter circuits 104. In various cases, the second side 112 of the one or more filter circuits 104 can be a transceiver-side of the one or more filter circuits 104. In other words, the second side 112 can be a side of the one or more filter circuits 104 that comprises a signal path that is configured to connect to a transceiver (e.g., a transmitter circuit configured to transmit one or more signals, a receiver circuit configured to receive one or more signals, or a transceiver circuit configured to transmit or receive one or more signals, or the like).

Figure 3A:
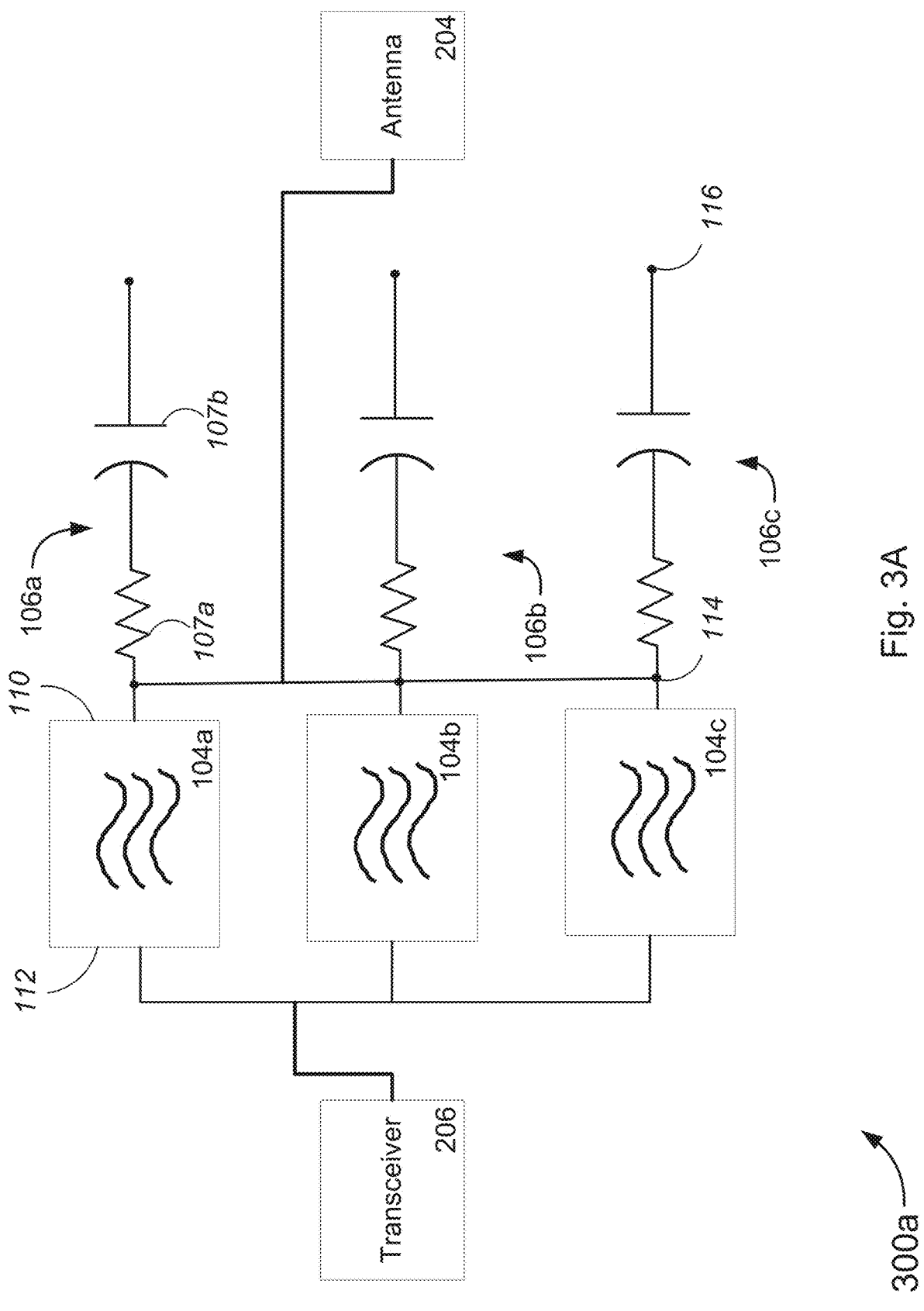
FIG. 3A is a circuit diagram of the semiconductor device of FIG. 2, in accordance with various embodiments.
Figure 3B:
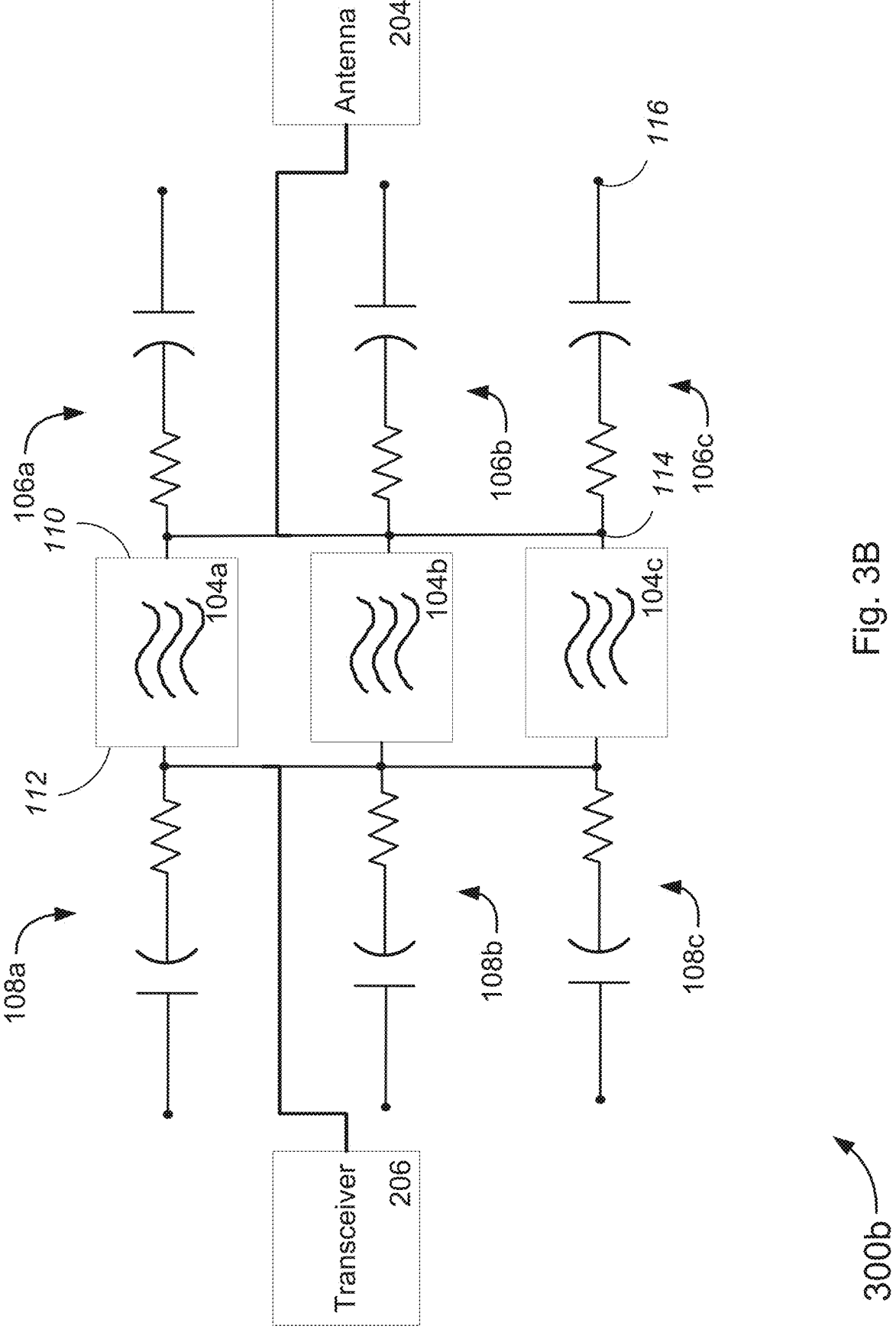
FIG. 3B is a circuit diagram of another semiconductor device comprising one or more first resistive circuits and one or more second resistive circuits, in accordance with various embodiments.
Figure 6A:
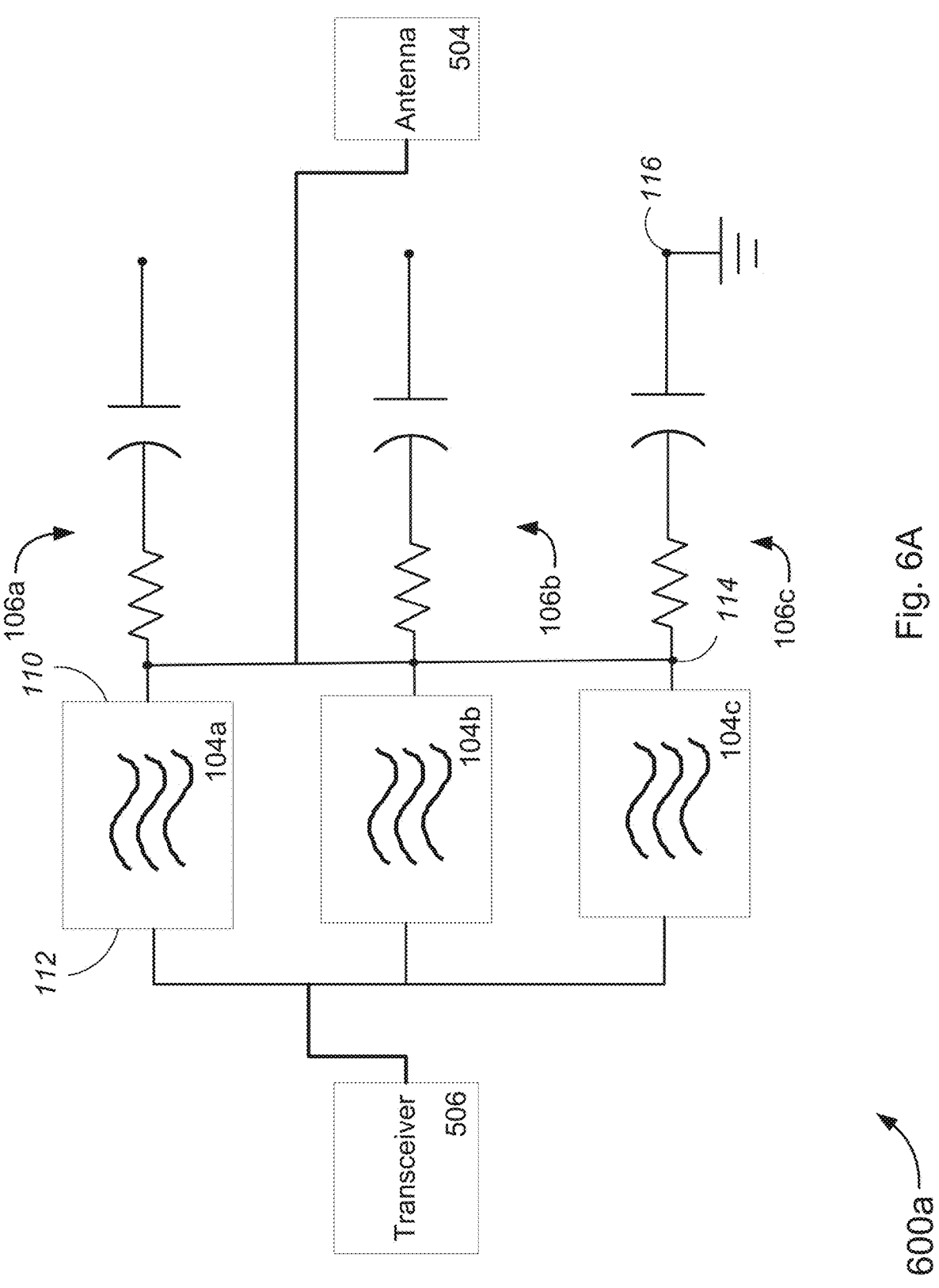
FIG. 6A is a circuit diagram of the semiconductor device of FIG. 5, in accordance with various embodiments.
Figure 6B:
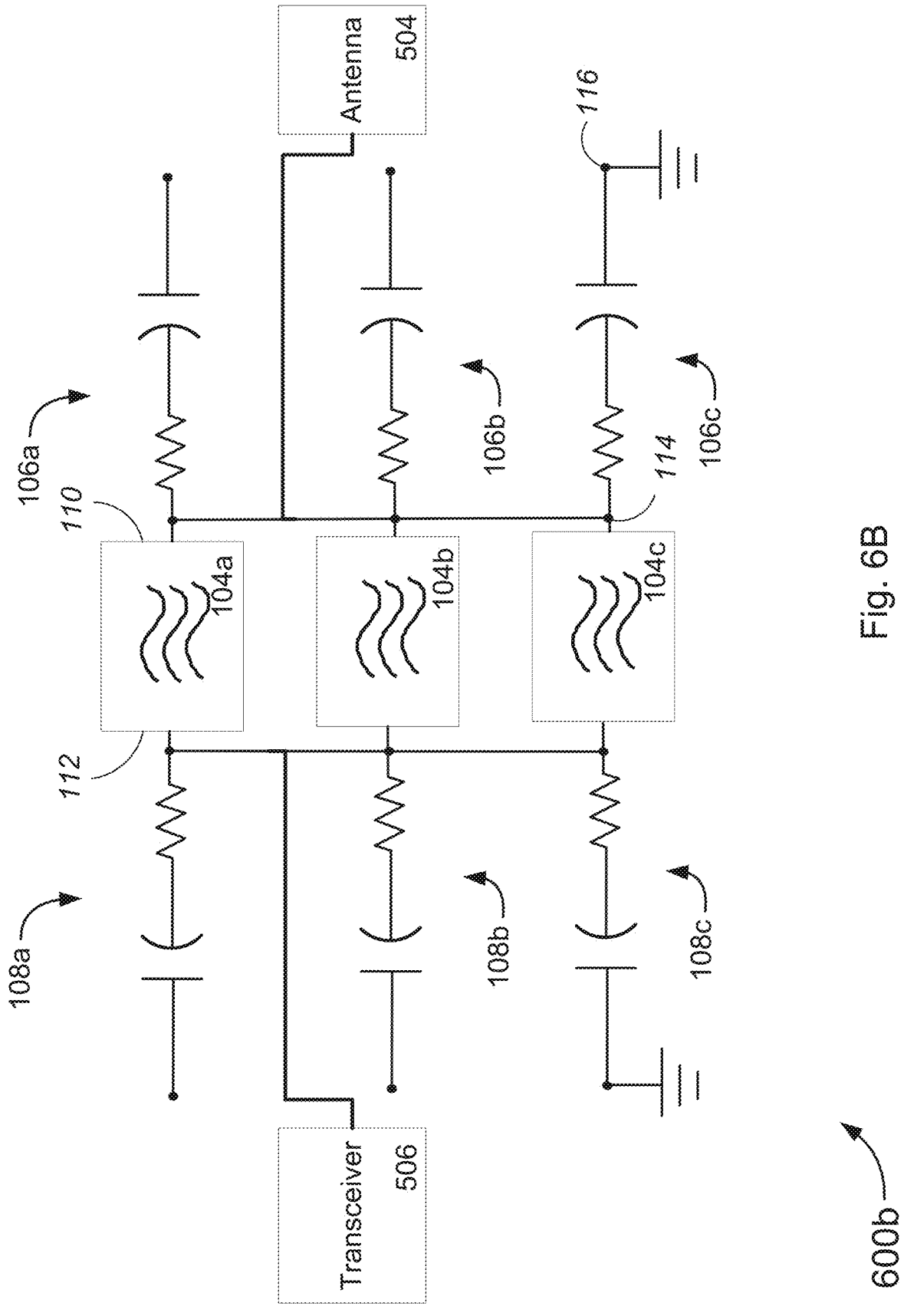
FIG. 6B is a circuit diagram of another semiconductor device comprising one or more first resistive circuits, one or more second resistive circuits, and at least one filter circuit that is not in use, in accordance with various embodiments.

Alternatively, in other cases, the one or more first resistive circuits 106 can be connected to the first side 110 of the one or more filter circuits 104 while the one or more second resistive circuits 108 can be connected to the second side 112 of the one or more filter circuits as shown in FIGS. 1B, 3B, and 6B. This configuration has the added advantage of connecting both sides 110 and 112 of the one or more filter circuits 104 to ground when the one or more filter circuits 104 are not in use. By connecting both sides of the one or more filter circuits 104 to ground when the one or more filter circuits 104 are not in use, the one or more resistive circuits 106 and 108 act as one or more termination points for the filter circuits 104 on both sides 110 and 112 of the one or more filter circuits 104.

In various cases, in order to connect the one or more first resistive circuits 106 or the one or more second resistive circuits 108 to the one or more filter circuits 104, one or more inner connectors 114 can be connected to a first end 118 of the one or more first resistive circuits 106 or the one or more second resistive circuits 108. The one or more inner connectors 114 can further be connected to a first side 110 or a second side 112 which can also be input sides or output sides of the one or more filter circuits 104. In other words, the first side 110 can be configured to transmit or receive one or more signals from the antenna 204 while the second side 112 can be configured to transmit or receive one or more signals from the transceiver 206. The one or more inner connectors 114 can include, without limitation, one or more solder bumps or pads, one or more bond pads, one or more posts, one or more vias, or one or more other connectors. The one or more inner connectors 114 can be formed from a conductive material, including, but not limited to copper, tungsten, aluminum, gold, silver, tin, nickel, lead, or a combination of metals/alloys, or may be formed of other electrically conductive material or combination of electrically conductive materials. In various cases, the one or more inner connectors 114 can be formed on the substrate 100.

In some embodiments, in order to terminate (e.g., to ground or the like) the one or more first resistive circuits 106 or the one or more second resistive circuits 108, one or more outer connectors 116 can be connected to a second end 120 opposite the first end 118 of the one or more first resistive circuits 106 or the one or more second resistive circuits 108. The one or more outer connectors 116 can include, without limitation, one or more solder bumps or pads, one or more bond pads, one or more posts, one or more vias, or one or more other connectors. The one or more outer connectors 116 can be formed from a conductive material, including, but not limited to copper, tungsten, aluminum, gold, silver, tin, nickel, lead, or a combination of metals/alloys, or may be formed of other electrically conductive material or combination of electrically conductive materials. In various cases, the one or more outer connectors 116 can be formed on the substrate 100.

In various instances, as discussed briefly above the one or more filter circuits 104 can be configured in a first configuration or a second configuration. In the first configuration, the one or more filter circuits 104 can be configured to be operational, used, or in use. In other words, the one or more filter circuits 104 can be configured to transmit or receive one or more signals at a specific frequency and the one or more resistive circuits 106 or 108 can be unterminated (e.g., the second end 120 of the one or more resistive circuits 106 or 108 can be left hanging or dangling, not connected to ground, or the like).

In the second configuration, the one or more filter circuits 104 can be configured to not be operational, not be used, or not in use. In other words, the one or more filter circuits 104 can be configured to not transmit or not receive one or more signals at a specific frequency to an antenna or transceiver and the one or more resistive circuits 106 or 108 can be terminated (e.g., the second end 120 of the one or more resistive circuits 106 or 108 can be connected to ground, the second end 120 of the one or more resistive circuits 106 or 108 can be connected to a device that matches the impedance of the one or more resistive circuits 106 or 108, or the like) at a termination point having an appropriate impedance point. The termination point can be a ground which mirrors or presents to the unused filter circuit the impedance that the unused filter circuit would have previously been subject to if the unused filter circuit was used. These first and second configurations will be discussed in more detail below with respect to FIGS. 2-9.

Turning to FIG. 2, FIG. 2 is a top view of a semiconductor device 200 comprising the substrate 100 including one or more filter circuit arrays 102 in the first configuration. In various cases, the substrate 100 and the one or more filter circuit arrays 102 can be similar to or about the same as the substrate 100 and the one or more filter circuit arrays 102 described with respect to FIG. 1A or 1B.

In various cases, the substrate 100 can be coupled to a second substrate 202. The second substrate 202 can include or be, without limitation, an interposer (e.g., a substrate or layer configured to provide one or more connections or interconnections (e.g., electrical connections, or the like)) between two other substrates or semiconductor components (not shown), a circuit board such as a printed circuit board, a packaging substrate, or another substrate configured to provide a supporting material upon which or within which elements or components of the semiconductor device are fabricated or coupled.

In the embodiment shown in FIG. 2, the one or more filter circuits 104 of the filter circuit array 102 can be configured in the first configuration. In other words, the one or more filter circuits 104 can be configured to transmit or receive one or more signals to or from an antenna 204 or a transceiver 206 and the one or more resistive circuits 106 or 108 can be unterminated. In other words, the one or more outer connectors 116 of the one or more resistive circuits 106 or 108 are left dangling or are not connected to ground. In a non-limiting example, as discussed above, the first filter circuit 104a can be configured to transmit or receive one or more GSM signals to or from the antenna 204 or the transceiver 206, the second filter circuit 104b can be configured to transmit or receive one or more LTE signals to or from the antenna 204 or the transceiver 206, and the third filter circuit 104c can be configured to transmit or receive one or more UMTS signals to or from the antenna 204 or the transceiver 206.

In the first configuration, one or more signal lines 208 can be connected to the inner connector 114 of the one or more resistive circuits 106 or 108. The one or more signal lines 208 can be one or more of one or more traces, one or more lines, one or more wires, one or more cables, one or more posts, one or more vias, or one or more other connectors, or the like configured to transmit or receive one or more signals. The one or more signal lines 208 can be formed from one or more conductive materials, including, but not limited to copper, tungsten, aluminum, gold, silver, tin, nickel, lead, or a combination of metals/alloys, or may be formed of other electrically conductive material or combination of electrically conductive materials.

By connecting each of the one or more signal lines 208 to a corresponding inner connector 114 of the one or more resistive circuits 106 or 108 or a first side 110 or second side 112 of the one or more filter circuits 104, the one or more signals can be transmitted or received by the one or more filter circuits 104 to or from the antenna 204 or the transceiver 206. In other words, the one or more signals transmitted or received by the one or more filter circuits 104 can bypass or be routed around the one or more resistive circuits 106 or 108 which are left dangling and instead be transmitted or received by the antenna 204 or the transceiver 206. In this way, when the one or more filter circuits 104 are in the first configuration, the one or more resistive circuits 106 or 108 are vestigial loads (e.g., unterminated loads, dangling loads, or the like) that have little to no effect on the filter circuit array 102.

Figure 4:
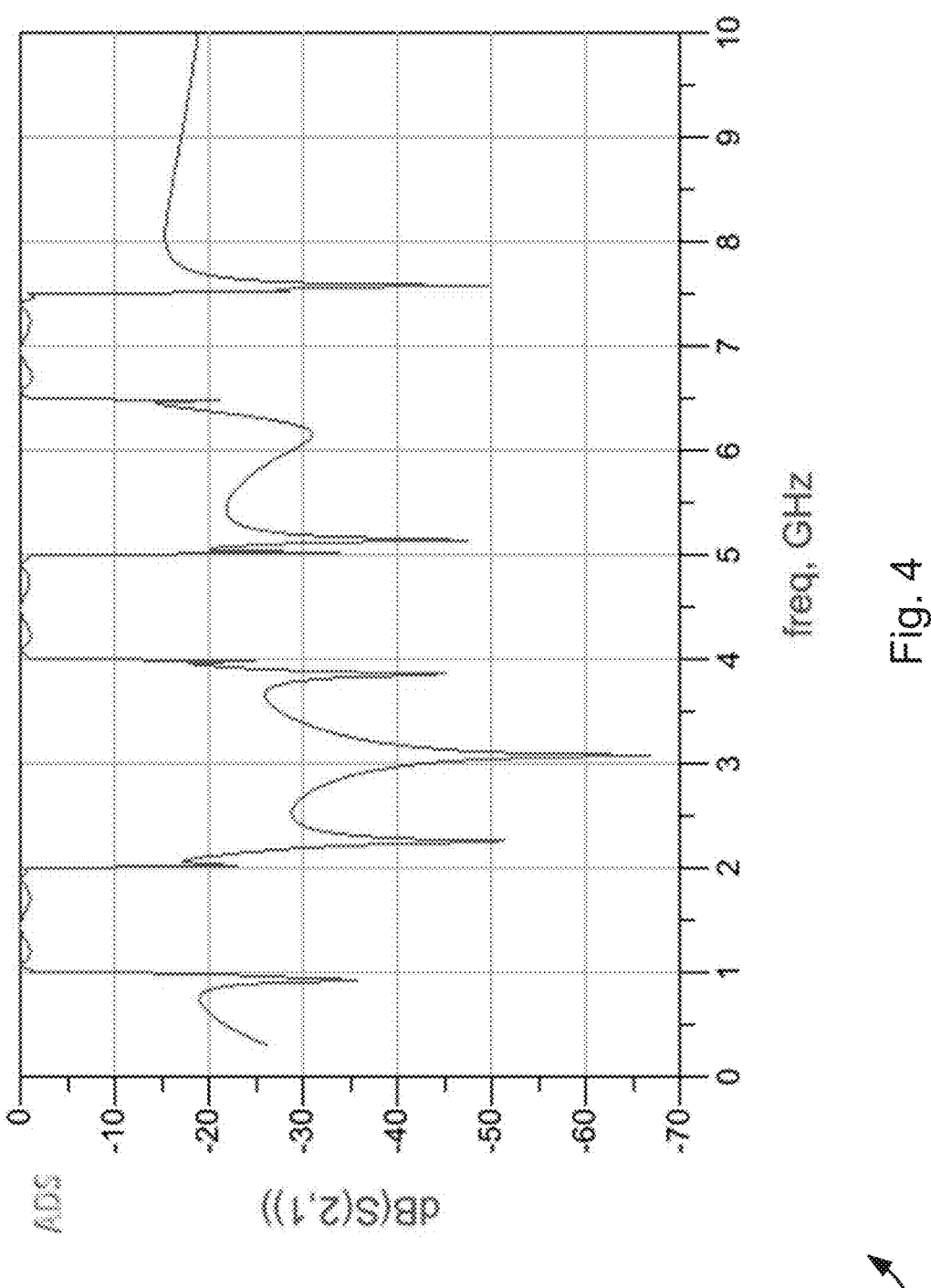
FIG. 4 is a graph showing the effect of the one or more first resistive circuits or one or more second resistive circuits of FIGS. 3A and 3B, in accordance with various embodiments.

The fact that the one or more resistive circuits 106 or 108 are vestigial loads that have little to no effect on the filter circuit array 102 can be seen using the circuit diagrams 300*a* and 300*b* of FIGS. 3A and 3B and the graph 400 of FIG. 4 which shows the effect of the one or more resistive circuits 106 or 108 of FIGS. 3A and 3B. In the circuit diagrams 300*a* and 300*b*, the one or more resistive circuits 106 or 108 can include a resistive element 107*a* and a capacitive element 107*b*. The capacitive element 107*b* represents an open-end capacitive effect of the one or more resistive circuits 106 or 108. It has been found using the simulations of FIGS. 3A and 3B, that the vestigial loads or one or more resistive circuits 106 or 108, when dangling off the filter circuits, have little effect on the performance of the filter circuit. The vestigial loads are physically small. The end capacitance of the dangling or unterminated end of the vestigial load is also very small. Thus, there is no significant effect to the filter performance.

As shown in FIG. 4, the first filter circuit 104*a* of FIG. 3A or 3B can be configured to transmit or receive one or more signals to or from the antenna 204 or the transceiver 206 at 1.5 Gigahertz (GHz), the second filter circuit 104*b* of FIG. 3A or 3B can be configured to transmit or receive one or more signals to or from the antenna 204 or the transceiver 206 at 4.5 GHZ, and the third filter circuit 104*c* of FIG. 3A or 3B can be configured to transmit or receive one or more signals to or from the antenna 204 or the transceiver 206 at 7 GHz.

As shown in FIG. 4, when the one or more resistive circuits 106 or 108 are coupled to the one or more filter circuits 104, the parasitic capacitance of the resistive circuits 106 or 108 is insignificant and the one or more filter circuits 104 are still able to pass one or more signals at different frequencies. For example, the first filter circuit 104*a* can still transmit or receive one or more signals to or from an antenna 204 or transceiver 206 at 1.5 Gigahertz (GHz), the second filter circuit 104*b* can still transmit or receive one or more signals to or from an antenna 204 or transceiver 206 at 4.5 GHZ, and the third filter circuit 104*c* can still transmit or receive one or more signals to or from an antenna 204 or transceiver 206 at 7 GHz while interference or perturbance from other frequencies is reduced within the filter circuit array 102. Thus, coupling unterminated resistive circuits to the one or more filter circuits 104 has little to no effect on the ability of one or more filter circuits 104 to transmit or receive one or more signals at one or more frequencies.

Turning back to FIG. 2, the semiconductor device 200 can further include one or more matching circuits 210 or matching network circuits. In RF communications, use of a common antenna 204 often requires matching an impedance of the one or more signals transmitted or received from the one or more filter circuits 104 of the filter circuit array 102 to the impedance of the antenna 204. The one or more matching circuits 210 can be used to control the impedances of the one or more filter circuits 104 such that when combined the impedance of the one or more filter circuits combined matches or is about the same as the input impedance of the antenna 204. In a non-limiting example, if the antenna 204 has an input impedance of 50 ohms, then the one or more matching circuits 210 can be configured to control the input impedances of the one or more filter circuits 104 such that the impedances of the one or more filter circuits 104 combined are about 50 ohms.

In various cases, an impedance of the one or more matching circuits 210 can be about 50 ohms. In some cases, the input and output impedance of a filter circuit in the filter circuit array 102 may not be designed to be 50 ohms. In certain instances, since the filter circuits are connected together with matching circuits, a filter circuit might be designed to have some other impedance. This impedance could be real or complex in value. The associated matching circuit 210 with the filter input or output could be tailored to more closely match the actual impedance of the filter. In order to match the second impedance of the one or more filter circuits 104, a third impedance of the one or more corresponding matching circuits 210 can be the same as or about the same complex conjugate of the real and imaginary part of the impedance of the one or more filter circuits 104. By ensuring the third impedance of the one or more matching circuits 210 can be about a complex conjugate of a second input impedance of the at least one filter circuit, the reflection of the transmission of the one or more signals can be reduced and the power transfer can be maximized between the at least one filter circuit and the antenna 204.

Figure 5:
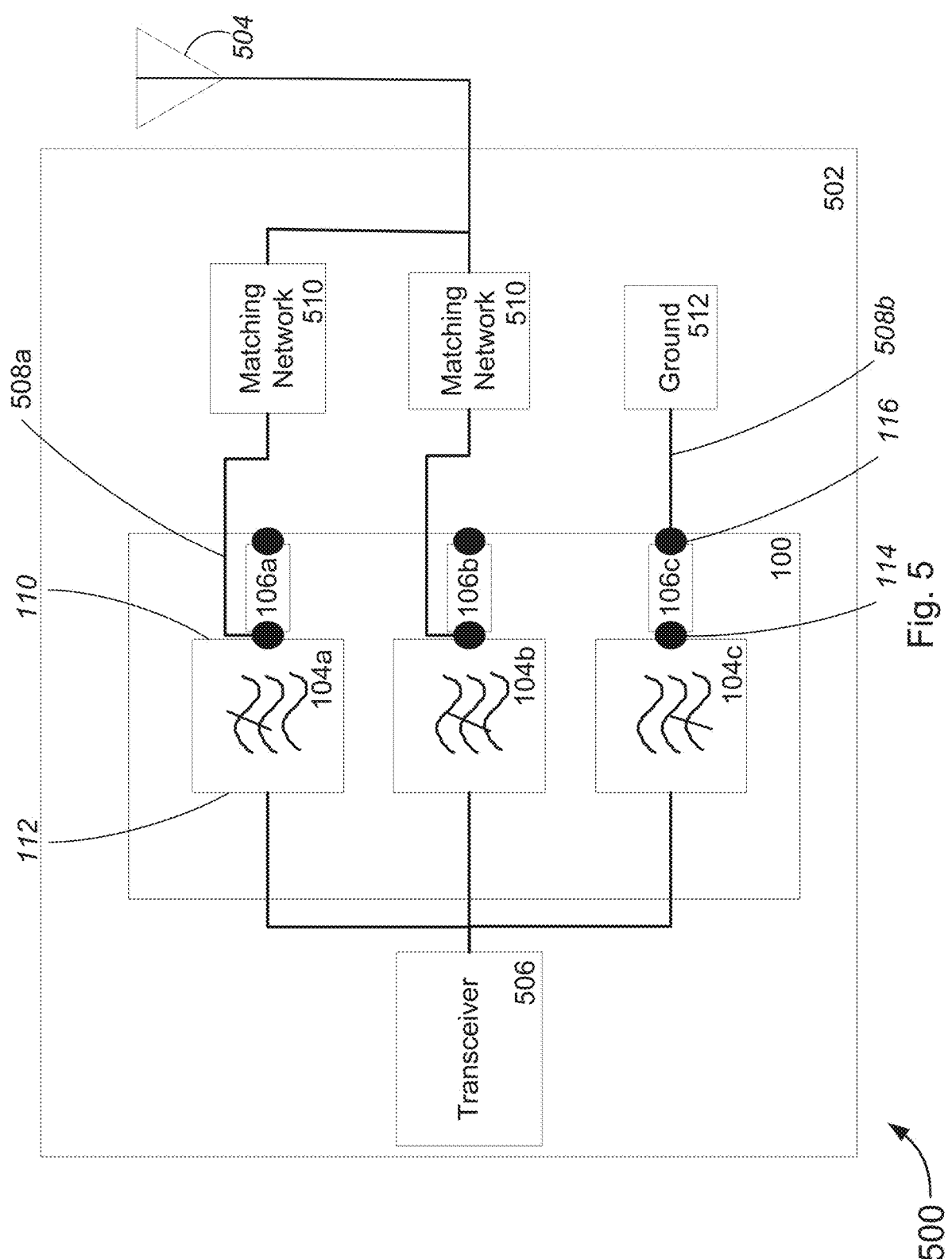
FIG. 5 is a top view of another semiconductor device comprising the substrate of FIG. 1, in accordance with various embodiments.

Turning to FIG. 5, FIG. 5 is a top view of a semiconductor device 500 comprising the substrate 100 including at least one third filter circuit 104*c* in a second configuration. Although in FIG. 5, it is the third filter circuit that is in the second configuration, a person of ordinary skill in the art would understand the other filter circuits (e.g., first filter circuit 104*a*, second filter circuit 104*b*, or another filter circuit, or the like) could be configured to be in the second configuration as well. In various cases, the substrate 100 and the one or more filter circuit arrays 102 can be similar to or about the same as the substrate 100 including the one or more filter circuit arrays 102 described with respect to FIG. 1A or 1B. In various cases, the substrate 100 can be coupled to a second substrate 502. The second substrate 502 can be similar to the second substrate 202.

In the non-limiting embodiment shown in FIG. 5, the first filter circuit 104*a* and the second filter circuit 104*b* can be configured in the first configuration. In other words, the first filter circuit 104*a* and the second filter circuit 104*b* can be configured to transmit or receive one or more signals to or from an antenna 504 or a transceiver 506 and the one or more resistive circuits 106 or 108 can be unterminated or left dangling. The antenna 504 can be similar to the antenna 204 and the transceiver 506 can be similar to the transceiver 206 of FIG. 2.

Additionally, in the embodiment shown in FIG. 5, at least one third filter circuit 104*c* of the one or more filter circuits 104 of the filter circuit array 102 can be configured in the second configuration. In other words, the at least one third filter circuit 104*c* can be configured to not transmit or receive one or more signals to or from an antenna 304 or transceiver 306 and the one or more resistive circuits 106 or 108 can be terminated (e.g., connected to ground 212 or other appropriate impedance which will result in the proper termination of the filter circuit 104c to eliminate the perturbation of adjacent filter circuits in the filter circuit array 102).

In the first configuration, one or more first signal lines 508a can be connected to the inner connector 114 of the first filter circuit 104a and the second filter circuit 104b. In the second configuration, one or more second signal lines 508b can be connected to the outer connector 116 of the at least one third filter circuit 104c. The one or more signal lines 508a or 508b can be similar to the one or more signal lines 208 of FIG. 2.

By connecting each of the one or more signal lines 508b to a corresponding outer connector 116, one or more signals transmitted or received by the at least one third filter circuit 104c can be transmitted to ground 512. In other words, the one or more signals transmitted or received by the at least one third filter circuit 104c can be transmitted to ground via the one or more resistive circuits 106 or 108. In this way, when the at least one third filter circuit 104c is in the second configuration, the one or more resistive circuits 106 or 108 provide a signal path to conduct one or more signals received or transmitted by the at least one third filter circuit 104c to a termination point such as ground 512.

In various cases, in order to configure the at least one third filter circuit 104c in the second configuration, the first impedance of the one or more resistive circuits 106c or 108c can be about 50 ohms. In some cases, the input and output impedance of a filter circuit in a filter array may not be designed to be 50 ohms. In certain instances, a filter circuit might be designed to have some other impedance. This impedance could be real or complex in value. The associated vestigial load of the one or more resistive circuits 106c or 108c associated with the filter circuit could be tailored to more closely match the actual impedance of the filter circuit. For example, the first impedance of the one or more resistive circuits 106c or 108c can be about a complex conjugate of the real and imaginary part of the second impedance of the third filter circuit 104c.

By terminating the one or more resistive circuits 106c or 108c appropriately, the filter circuit 104C is electrically removed from the filter circuit array 102. However, the filter circuit 104c itself is still in the filter array 102 and the characteristics of the filter circuits 104a and 104b remain unchanged. Further, by terminating the filter circuit 104C by the one or more resistive circuits 106c or 108c, the input impedance seen by transceiver 506 does not change.

By connecting one or more filter circuits such as the third filter circuit 104c to a termination point such as ground 512 via the one or more resistive circuits 106 or 108, a user, customer, manufacturer, or the like of the semiconductor device 500 can customize the filter circuit array 102 to only transmit or receive one or more selected signals at selected frequencies. By leaving the at least one third filter circuit 104c in the filter circuit array 102 and connecting the at least one third filter circuit 104c to a termination point such as ground 512 via the one or more resistive circuits 106 or 108, non-use of the at least one third filter circuit 104c does not affect, perturb, or interfere with the performance of the first filter circuit 104a and the second filter circuit 104b. Thus, designers of the filter circuit array 102 do not need to redesign the filter circuit array 102 every time a user, customer, manufacturer, or the like wants to remove one or more filter circuits 104.

Figure 7:
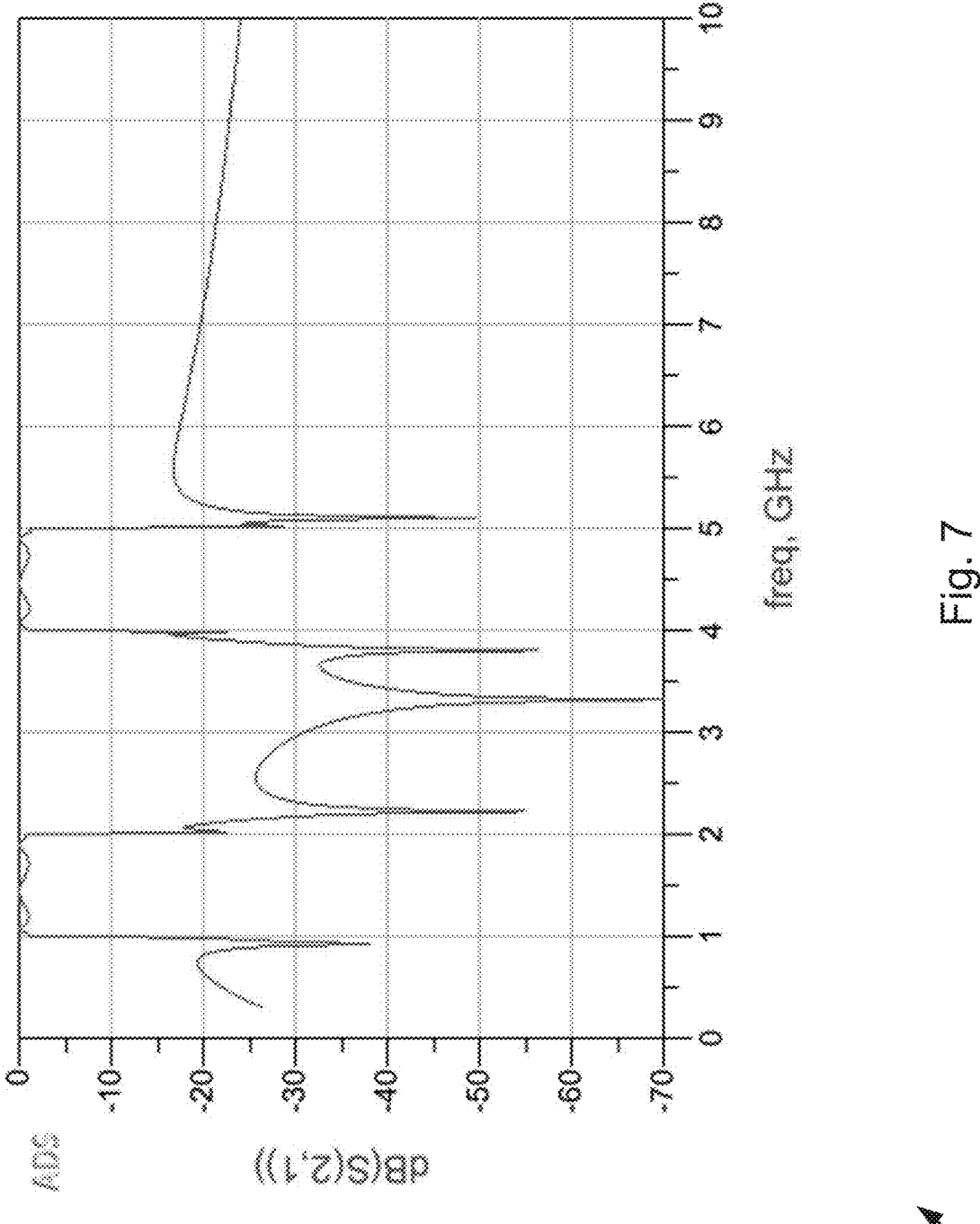
FIG. 7 is a graph showing the effect of the one or more first resistive circuits or one or more second resistive circuits of FIGS. 6A and 6B, in accordance with various embodiments.

The fact that connecting the third filter circuit 104c to ground via the one or more resistive circuits 106 or 108 has little to no effect on the filter circuit array 102 can be seen using the circuit diagrams 600A and 600B of FIGS. 6A and 6B and the graph 700 of FIG. 7 which shows the effect of terminating the at least one third filter circuit 104c.

Similar to FIG. 3, the first filter circuit 104a can be configured to transmit or receive one or more signals to or from the antenna 504 or the transceiver 506 at 1.5 GHz, the second filter circuit 104b can be configured to transmit or receive one or more signals to or the antenna 504 or the transceiver 506 at 4.5 GHZ, and the third filter circuit 104c can be configured to transmit or receive one or more signals at 7 GHz. However, because the third filter circuit 104c is connected to a termination point via the resistive circuit 106c or 108c, the third filter circuit 104c is not configured to transmit or receive one or more signals to or from the antenna 504 or the transceiver 506 at 7 GHz.

As shown in FIG. 7, when the resistive circuit 106c or 108c connects the third filter circuit 104c to a termination point, the parasitic capacitance of the third filter circuit 104c connected to ground via resistive circuits 106c or 108c is insignificant and the other filter circuits 104a and 104b are still able to pass one or more signals at different frequencies. For example, the first filter circuit 104a can still transmit or receive one or more signals to or from the antenna 504 or the transceiver 506 at 1.5 Gigahertz (GHz) and the second filter circuit 104b can still transmit or receive one or more signals to or from the antenna 504 or the transceiver 506 at 4.5 GHZ, while the third filter circuit 104c is disabled or electrically removed and unable to transmit or receive one or more signals to or from the antenna 504 or the transceiver 506 at 7 GHz.

Turning back to FIG. 5, the semiconductor device 200 can further include one or more matching circuits 510. The matching circuits 510 can be similar to the matching circuits 210 of FIG. 2. Because the one or more matching circuits 510 can be used to control the impedances of the one or more filter circuits 104 such that when combined the impedance of the one or more filter circuits 104 combined matches or is about the same as the impedance of the antenna 504, the one or more matching circuits 510 can be redesigned or reconfigured when the third filter circuit 104c is in the second configuration or not in use. It is often easier to redesign the one or more matching circuits 510 than it is to redesign the filter circuit array 102. This is because filter array design is an iterative process while the matching circuits are more isolated and do not interact with each other as much as the filter circuits. For example, each filter circuit is designed separately, then the filter circuits are put together on a monolithic substrate. When the filters are put together on the monolithic substrate adjustments to each filter need to be made to ensure each filter does not interfere with another filter on the substrate. Matching circuits on the other hand are typically designed on a circuit board which allows the matching circuits to be more isolated.

Figure 8:
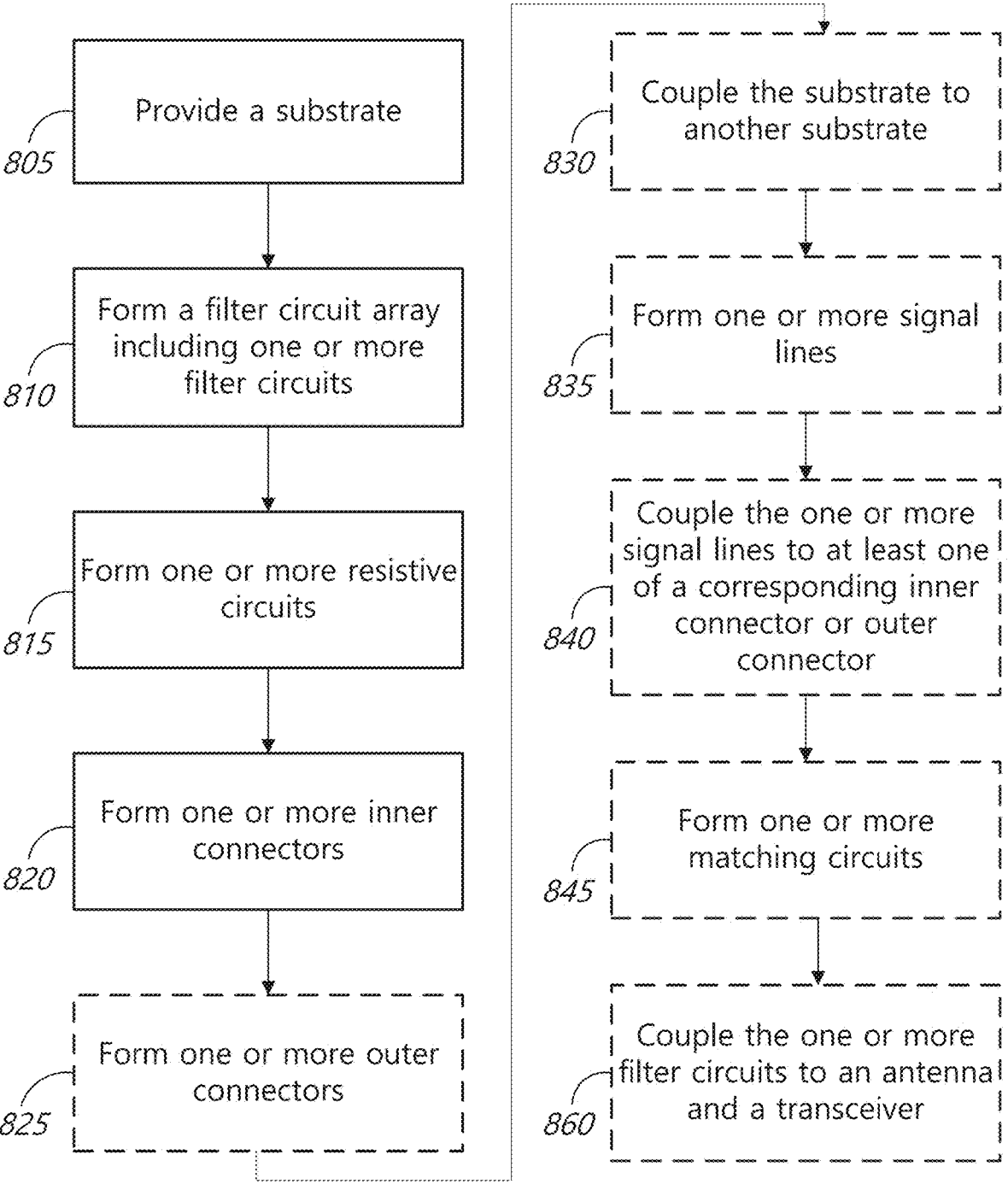
FIG. 8 is a flow diagram of a method of manufacturing a semiconductor device comprising a filter circuit array, in accordance with various embodiments.

FIG. 8 is a flow diagram of a method 800 of manufacturing a semiconductor device, in accordance with various embodiments. The method described in FIG. 8 is one way the components of FIGS. 1-3, 5, and 6 can be manufactured. However, other methods may be used to manufacture the components of FIGS. 1-3, 5, and 6.

The method 800 may begin, at block 805 by providing or forming a substrate (e.g., substrate 100 of FIG. 1 or the like). Next, the method 800 can include, at block 810, forming a filter circuit array (e.g., filter circuit array 102 or the like) comprising one or more filter circuits (e.g., filter circuits 104 or the like) on or within the substrate. In various cases, the one or more filter circuits 104 can be configured to transmit or receive one or more signals. Each filter circuit of the one or more filter circuits can be configured to transmit or receive one or more signals at a different frequency than one or more other filter circuits of the one or more filter circuits.

The method 800, at block 815 can further include forming one or more resistive circuits (e.g., one or more first resistive circuits 106, one or more second resistive circuits 108, or the like) on or within the substrate. The one or more resistive circuits can be configured to have a first impedance of about 50 ohms or about a complex conjugate of a second impedance of the first filter circuit. The method 800, at block 820 can also include forming one or more inner connectors (e.g., inner connectors 114 or the like). The one or more inner connectors can be configured to connect the one or more filter circuits to the one or more resistive circuits. In some cases, the method 800, at optional block 825, can also include forming one or more outer connectors (e.g., outer connectors 116 or the like). The one or more outer connectors can be configured to connect the one or more resistive circuits to a termination point when a corresponding filter circuit is in a second configuration.

The method 800 can then continue to optional block 830 and include coupling the substrate to another substrate (e.g., second substrate 202, second substrate 502, or the like). This can be done at the same time the substrate or the other substrate is manufactured or later (e.g., by a user, customer, or manufacturer of a wireless communication device). The method 800, at optional block 835, can further include forming one or more signal lines and, at optional block 840, coupling the one or more signal lines to a corresponding inner connector or outer connecter of a filter circuit depending on whether the is in a first configuration or a second configuration as discussed above.

The method 800 can further include forming, at optional block 845, one or more matching circuits (e.g., matching circuits 210, matching circuits 510, or the like) on the other substrate and coupling, at optional block 850, the one or more matching circuits to the one or more signal lines. The one or more matching circuits can be coupled to one or more filter circuits in the first configuration. Once the matching circuits are coupled to the one or more signal lines, the method 800, at optional block 860, can include coupling the one or more filter circuits in the first configuration to an antenna (e.g., antenna 204, antenna 504, or the like) and a transceiver (e.g., transceiver 206, transceiver 506, or the like) of a wireless communication device, or the like.

The techniques and processes described above with respect to various embodiments may be used to manufacture the semiconductor devices or components of FIGS. 1-3, 5, and 6, and/or components thereof, as described herein.

Figure 9:
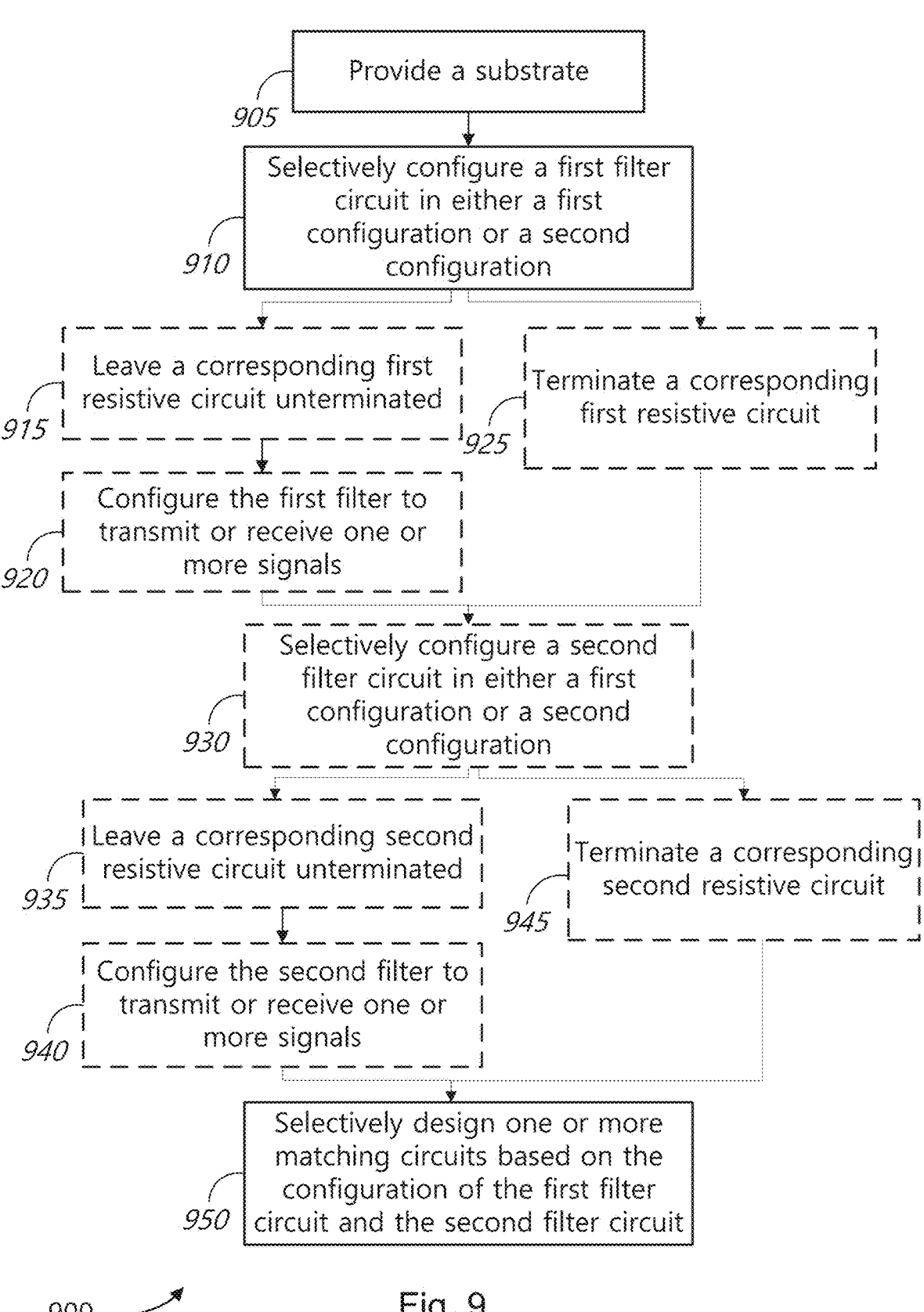
FIG. 9 is a flow diagram of a method of configuring a semiconductor device comprising a filter circuit array, in accordance with various embodiments.

FIG. 9 is a flow diagram of a method of configuring or using a filter circuit array, in accordance with various embodiments. The method described in FIG. 9 is one way the components of FIGS. 1-3, 5, and 6 can be used or configured. However, other methods may be used to use or configure the components of FIGS. 1-3, 5, and 6.

The method 900 may begin, at block 905 by providing a substrate (e.g., substrate 100 of FIG. 1 or the like) comprising a filter circuit array (e.g., filter circuit array 102 or the like) including one or more filter circuits (e.g., filter circuits 104 or the like) and one or more resistive circuits (e.g., one or more first resistive circuits 106, one or more second resistive circuits 108, or the like). In various cases, the one or more filter circuits can be configured to transmit or receive one or more signals. Each filter of the one or more filter circuits can be configured to transmit or receive one or more signals at a different frequency than one or more other filter circuits of the one or more filter circuits.

The substrate can also include one or more inner connectors (e.g., inner connectors or the like) and one or more optional outer connectors (e.g., outer connectors or the like). The one or more inner connectors can be configured to connect the one or more filter circuits to the one or more resistive circuits. The one or more outer connectors can be configured to connect the one or more resistive circuits to a termination point when a corresponding filter circuit is in a second configuration.

The method 900 can then continue to optional block 910 and include selectively configuring a first filter of the one or more filter circuits in either of a first configuration or a second configuration. In order to use the first filter circuit in a first configuration, the method 900 can include leaving one or more corresponding resistive circuits unterminated. In the first configuration, at optional block 920, the first filter circuit can further be configured to transmit or receive one or more signals between two or more components such as an antenna (e.g., antenna 204 or 504 or the like) and a transceiver (e.g., transceiver 206 or 506 or the like). In some cases, the first filter circuit in the first configuration can be connected to the antenna and the transceiver using one or more signal lines coupled to an inner connector (e.g., inner connector 114 or the like) of the first filter circuit.

In order to use the first filter circuit in a second configuration, the method 900 can include, at optional block 925, connecting the first filter circuit to a termination point on at least one of an antenna-side of the first filter circuit or a transceiver side of the first filter circuit via the one or more resistive circuits. In some cases, the first filter circuit in the second configuration can be connected to the termination point using one or more signal lines coupled to the termination point and an outer connector (e.g., outer connector 116 or the like) of the one or more resistive circuits.

The method 900 can then continue to optional block 930 and include selectively configuring a second filter circuit of the one or more filter circuits in either of a first configuration (referred to as third configuration in the claims for antecedent basis purposes) or a second configuration (referred to as fourth configuration in the claims for antecedent basis purposes). In order to use the second filter circuit in a first configuration, the method 900 can include connecting the first filter circuit to an antenna (e.g., antenna 204, antenna 504, or the like) and a transceiver (e.g., transceiver 206, transceiver 506, or the like). In some cases, the first filter in the first configuration can be connected to the antenna and the transceiver using one or more signal lines coupled to the inner connector.

In order to use the second filter circuit in a first configuration, the method 900, at optional block 935, can include leaving one or more corresponding resistive circuits unterminated. In the first configuration, at optional block 940, the second filter circuit can further be configured to transmit or receive one or more signals between two or more components such as an antenna (e.g., antenna 204 or 504 or the like) and a transceiver (e.g., transceiver 206 or 506 or the like). In some cases, the second filter circuit in the first configuration can be connected to the antenna and the transceiver using one or more signal lines coupled to an inner connector (e.g., inner connector 114 or the like) of the second filter circuit.

In order to use the second filter circuit in a second configuration, the method 900 can include, at optional block 945, connecting the second filter circuit to a termination point on at least one of an antenna-side of the second filter circuit or a transceiver side of the second filter circuit via the one or more resistive circuits. In some cases, the second filter circuit in the second configuration can be connected to the termination point using one or more signal lines coupled to the termination point and an outer connector (e.g., outer connector 116 or the like) of the one or more resistive circuits.

This process can then be repeated for each of the filter circuits of the filter circuit array until all of one or more filter circuits of the filter circuit array are set up in at least one of the first configuration (or third configuration) or the second configuration (or fourth configuration).

The method 900 can further include forming, at optional block 950, designing one or more matching circuits based on which filter circuits of the one or more filter circuits are in the first configuration or the second configuration.

The techniques and processes described above with respect to various embodiments may be used to configure the semiconductor devices or components of FIGS. 1-3, 5, and 6, and/or components thereof, as described herein.

Thus, as discussed above, by providing one or more filter circuits (e.g., filter circuits 104 or the like) capable of being configured in a first or second configuration, users, customers, manufacturers, or the like can easily customize the filter circuit array (e.g., filter circuit array 102 or the like) based on their needs. Adding the one or more resistive circuits (e.g., one or more resistive circuits 106 or 108) connected to the one or more filter circuits of the filter circuit array allows designers of the filter circuit array to provide a customizable filter circuit array without having to redesign the filter circuit array every time a user, customer, manufacturer, or the like wants to remove or not use a filter circuit of the filter circuit array.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with or without some features for ease of description and to illustrate aspects of those embodiments, the various components and/or features described herein with respect to a particular embodiment can be substituted, added and/or subtracted from among other described embodiments, unless the context dictates otherwise. Consequently, although several embodiments are described above, it will be appreciated that the invention is intended to cover all modifications and equivalents within the scope of the following claims.

What is claimed is:

1. A filter circuit array comprising:
a first filter circuit formed on a substrate; and
a first resistive circuit formed on the substrate and connected to the first filter circuit;
wherein the first resistive circuit is unterminated, and wherein a first impedance of the first resistive circuit is about a complex conjugate of a second impedance of the first filter circuit.

2. The filter circuit array of claim 1, wherein the first resistive circuit is connected to a first side of the first filter circuit configured to be coupled to an antenna.

3. The filter circuit array of claim 2, further comprising a second resistive circuit formed on the substrate, wherein the second resistive circuit is connected to a second side of the first filter circuit configured to be coupled to a transceiver circuit.

4. The filter circuit array of claim 1, wherein a first impedance of the first resistive circuit is about 50 ohms.

5. The filter circuit array of claim 1, wherein the first filter circuit is configured to transmit or receive one or more first signals comprising at least one of one or more first universal mobile telecommunications system (UMTS) signals, one or more first global system for mobile communication (GSM) signals, one or more first wideband code division multiple access (WCDMA) signals, or one or more first Long-Term Evolution (LTE) signals.

6. The filter circuit array of claim 1, wherein the first resistive circuit comprises a first connector formed on the substrate and connected to the first filter circuit and a first end of the first resistive circuit and a second connector formed on the substrate and located on a second end opposite the first end of the first resistive circuit.

7. The filter circuit array of claim 1, further comprising a second resistive circuit formed on the substrate, wherein the second resistive circuit is connected to a same side of the first filter circuit as the first resistive circuit.

8. A filter circuit array comprising:
a first filter circuit formed on a substrate;
a first resistive circuit formed on the substrate and connected to the first filter circuit; and
a second resistive circuit formed on the substrate;
wherein the first resistive circuit is unterminated, and wherein the second resistive circuit is connected to a same side of the first filter circuit as the first resistive circuit.

9. The filter circuit array of claim 8, wherein the first resistive circuit and the second resistive circuit have different impedances.

10. A filter circuit array comprising:
a first filter circuit formed on a substrate; and
a first resistive circuit formed on the substrate and connected to the first filter circuit;
wherein the first resistive circuit is unterminated, and wherein the first resistive circuit comprises a first connector formed on the substrate and connected to the first filter circuit and a first end of the first resistive circuit and a second connector formed on the substrate and located on a second end opposite the first end of the first resistive circuit.

11. The filter circuit array of claim 10, wherein, when the first filter circuit is operational, a line is connected to the first connector and configured to transmit or receive a signal, and wherein, when the first filter circuit is not operational, the second connector of the first resistive circuit is terminated.

12. A semiconductor device, comprising:
a first substrate comprising:
a first filter circuit; and
a first resistive circuit connected to the first filter circuit;
wherein, when the first filter circuit is in use, the first filter circuit is configured to transmit or receive one or more first signals between an antenna and a transceiver and the first resistive circuit is unterminated;
wherein, when the first filter circuit is not in use, the first filter circuit is connected to a first ground via the first resistive circuit; and
wherein a first impedance of the first resistive circuit is about a complex conjugate of a second impedance of the first filter circuit.

---

---

21

13. The semiconductor device of claim 12, further comprising:

a second substrate coupled to the first substrate, the second substrate comprising a matching circuit connected to the first filter circuit when the first filter circuit is in use.

14. The semiconductor device of claim 13, wherein a third impedance of the matching circuit is about a complex conjugate of a second impedance of the first filter circuit.

15. The semiconductor device of claim 12, wherein the first substrate further comprises:

a second filter circuit;

a second resistive circuit connected to the second filter circuit;

the antenna; and the transceiver;

wherein the first filter circuit is in use, connected to the antenna and transceiver, and the first resistive circuit is unterminated and the second filter circuit is not in use and connected to a second ground via the second resistive circuit.

16. The semiconductor device of claim 15, wherein a third impedance of the second resistive circuit is about a complex conjugate of a fourth impedance of the second filter circuit, and wherein the second impedance of the first filter circuit is different from the fourth impedance of the second filter circuit.

17. The semiconductor device of claim 16, further comprising:

a second substrate coupled to the first substrate, the second substrate comprising a matching circuit connected to the first filter circuit.

18. A method of using a filter circuit array, the method comprising:

providing a first substrate comprising:

a filter circuit array comprising:

a first filter circuit; and a first resistive circuit connected to the first filter circuit, wherein a first impedance of the first resistive circuit is about a complex conjugate of a second impedance of the first filter circuit; and selectively configuring the first filter circuit in either of a first configuration or a second configuration, by:

for the first configuration, leaving the first resistive circuit unterminated; and for the second configuration, connecting the first filter circuit to ground via the first resistive circuit.

19. The method of claim 18, wherein the filter circuit array further comprises:

a second filter circuit; and a second resistive circuit connected to the second filter circuit; and wherein the method further comprises:

selectively configuring the second filter circuit in either of a third configuration or a fourth configuration, by:

for the third configuration, leaving the second resistive circuit unterminated; and for the fourth configuration, connecting the second filter circuit to ground via the second resistive circuit.

20. The method of claim 19, further comprising selecting the first configuration for the first filter circuit and connecting the first filter circuit to an antenna and leaving the first resistive circuit unterminated and selecting the fourth configuration for the second filter circuit and connecting the second filter circuit to ground via the second resistive circuit.

\* \* \* \* \*